United States Patent
Geisler (10) Patent No.: US 10,345,417 B2
(45) Date of Patent: Jul. 9, 2019

(54) POWER ON RESTORATION OF SENSOR HYSTERESIS

(71) Applicant: Allegro MicroSystems, LLC, Manchester, NH (US)

(72) Inventor: Dominik Geisler, Heidelberg (DE)

(73) Assignee: Allegro MicroSystems, LLC, Manchester, NH (US)

( * ) Notice: Subject to any disclaimer, the term of this patent is extended or adjusted under 35 U.S.C. 154(b) by 55 days.

(21) Appl. No.: 15/426,601

(22) Filed: Feb. 7, 2017

(65) Prior Publication Data

US 2018/0224516 A1 Aug. 9, 2018

(51) Int. Cl.
G01R 35/00 (2006.01)
G01D 21/00 (2006.01)

(52) U.S. Cl.
CPC .............. *G01R 35/00* (2013.01); *G01D 21/00* (2013.01)

(58) Field of Classification Search
CPC ................................ G01R 35/00; G01D 21/00
See application file for complete search history.

(56) References Cited

U.S. PATENT DOCUMENTS

| | | | |
|---|---|---|---|
| 6,388,488 B1 * | 5/2002 | Ho | H03K 3/356008 327/112 |
| 7,365,530 B2 | 4/2008 | Bailey et al. | |
| 7,592,801 B2 | 9/2009 | Bailey et al. | |
| 7,622,914 B2 | 11/2009 | Bailey et al. | |
| 7,772,838 B2 | 8/2010 | Bailey et al. | |
| 8,008,908 B2 * | 8/2011 | Doogue | G01D 5/145 324/173 |
| 8,134,402 B1 | 3/2012 | Lorenz | |
| 8,222,888 B2 | 7/2012 | David et al. | |
| 8,736,260 B2 | 5/2014 | Foletto et al. | |
| 9,395,391 B2 | 7/2016 | Fernandez et al. | |
| 2015/0378332 A1 | 12/2015 | Willcox | |

FOREIGN PATENT DOCUMENTS

DE 102010009821 9/2011

OTHER PUBLICATIONS

Allegro Datasheet A-1391 "Micro Power 3 V Linear Hall Effect Sensor ICs with Tri-State Output and User-Selectable Sleep Mode" Oct. 26, 2011, 16 pages.
European Extended Search Report dated Jun. 13, 2018 for European Application No. 18155270.4, 6 pages.
Response filed on Feb. 8, 2019 for European Application No. 18155270.4; 59 Pages.

* cited by examiner

*Primary Examiner* — Manuel L Barbee
(74) *Attorney, Agent, or Firm* — Daly, Crowley, Mofford & Durkee, LLP (57) ABSTRACT

Described embodiments provide circuits, systems and methods for generating a sensing signal in response to the ambient condition, comparing the sensing signal to a threshold hysteresis range to generate a digital signal, and upon powering on the sensor, determining whether the sensing signal is within the threshold hysteresis range and, if the sensing signal is within the threshold hysteresis range, setting the digital signal to a predetermined level based on a hysteresis restoration state associated with sensor before the sensor is powered off.

27 Claims, 10 Drawing Sheets

POWER ON RESTORATION OF SENSOR HYSTERESIS

BACKGROUND

Sensors can be used in various types of devices to measure and monitor properties of systems in a wide variety of different applications. For example, sensors have become common in products that rely on electronics in their operation, such as motor control systems and automobile control systems. Common examples of motor control applications include detection of the position and/or rotation of a motor and common examples of automotive applications include detection of ignition timing from a position or rotation of an engine crankshaft and/or camshaft, detection of wheel speed for anti-lock braking systems and four-wheel steering systems, detection of window positioning, and other applications.

Many sensors generate analog signals and compare the analog signals to a threshold to generate a digital output signal. Such sensors often employ a hysteresis feature to avoid undesirable switching glitches when generating digital output signals. Sensors often also employ power reduction features. For example, it is sometimes desirable to power off system components at certain times in order to reduce power consumption.

SUMMARY

This Summary is provided to introduce a selection of concepts in a simplified form that are further described in the Detailed Description. This Summary is not intended to identify key features or essential features of the claimed subject matter, nor is it intended to be used to limit the scope of the claimed subject matter.

According to the disclosure, a sensor includes one or more sensing elements, each responsive to an ambient condition associated with the sensor to generate a sensing signal indicative of a level of the ambient condition, a threshold comparison circuit responsive to the sensing signal from the one or more sensing elements and configured to generate a digital value associated with a comparison of the sensing signal to a threshold hysteresis range, and an output processor configured to generate a sensor output signal in response to digital values from the threshold comparison circuit, wherein upon powering on the sensor after the sensor is powered off, the threshold comparison circuit is configured to determine whether the sensing signal from the one or more sensing elements is in the hysteresis range and, if the sensing signal from the one of more sensing elements is in the hysteresis range, set the digital value to a predetermined value based upon a hysteresis restoration state associated with the comparison before the sensor is powered off. With this arrangement, if the analog input signal is within the hysteresis range when the sensor is powered on, the control system restores the hysteresis state prior to powering down the sensor in order to avoid output ambiguity.

Features may include one or more of the following. If the sensing signal is not in the hysteresis range, the threshold comparison circuit may be configured to set the digital value to a logic level associated with the comparison. The output processor may be configured to communicate digital values from the threshold comparison circuit as the sensor output signal. The output processor may be configured to process digital values from the threshold comparison circuit and to provide the sensor output signal in a form indicative of an absolute position, a relative position, a direction of movement, a speed of movement, a direction of rotation, or a speed of rotation of an object located proximate to the sensor.

Sensing signals from more than one sensing element may be combined to generate a first combined sensing signal for processing by a first sensor channel and sensing signals from more than one sensing element are combined to generate a second combined sensing signal for processing by a second sensor channel. A phase difference between the first combined sensing signal and the second combined sensing signal may be associated with a direction of movement or rotation of the object. The threshold comparison circuit may be responsive to the first combined sensing signal to generate a first digital value associated with a comparison of the first combined sensing signal to the hysteresis range and may be responsive to the second combined sensing signal to generate a second digital value associated with a comparison of the second combined sensing signal to the hysteresis range and an exclusive-OR value of the first digital value and the second digital value may be associated with a speed of movement of the object, and a direction of logic-level transition of the first digital value and the second digital value may be associated with a direction of movement or rotation of the object. The threshold comparison circuit may be configured to set the first digital value to a predetermined value based on a hysteresis restoration state associated with the first sensor channel and to set the second digital value to a predetermined value based on a hysteresis restoration state associated with the second sensor channel.

In some embodiments, the sensor is configured for use in a sensor system, and the sensor output signal is provided to a system controller. The sensor may be configured for use in a motor control system, and the sensor output signal may be provided to a motor controller and the sensor may be powered off when the motor is not intended to be rotating. In some embodiments, the sensor is implemented as an integrated circuit. The hysteresis restoration state may be provided by the sensor to the system controller in the form of the sensor output signal before the sensor is powered off. The hysteresis restoration state may be provided by the system controller to the sensor at a bidirectional input/output (I/O) pin of the sensor at which the sensor output signal is provided. The hysteresis restoration state may be provided by the system controller to the sensor at a hysteresis restoration input pin of the sensor. If the sensing signal is in the hysteresis range, the threshold comparison circuit may be configured to repeat determining whether the sensing signal is in the hysteresis range until the sensing signal is no longer in the hysteresis range. The hysteresis restoration state may be provided to the sensor by an external source. The threshold comparison circuit may be a Schmitt trigger circuit.

Also described is a method for sensing a level of an ambient condition with a sensor configured to be powered off to reduce power consumption and then powered on, including generating a sensing signal in response to the ambient condition, comparing the sensing signal to a threshold hysteresis range to generate a digital signal, upon powering on the sensor, determining whether the sensing signal is within the threshold hysteresis range, and if the sensing signal is within the threshold hysteresis range, setting the digital signal to a predetermined level based on a hysteresis restoration state associated with sensor before the sensor is powered off.

Features may include one more of the following. If the sensing signal is not within the threshold hysteresis range, the digital signal may be set to a logic level associated with the comparison. Generating the analog sensing signal may include using a magnetic field sensor. The method may further include generating a sensor output signal in response to the digital signal. Generating the sensor output signal may include generating the sensor output signal to indicate an absolute position, a relative position, a direction of movement, a speed of movement, a direction of rotation, or a speed of rotation of an object located proximate to the sensor. The method may further include providing the hysteresis restoration state to the sensor from a source external to the sensor and/or continuing to determine if the sensing signal is within the hysteresis range until the sensing signal is no longer in the hysteresis range.

According to a further aspect, a sensor includes means for sensing an ambient condition to generate a sensing signal, means for generating a digital signal in response to comparison of the sensing signal to a hysteresis range, and means for restoring a state of the digital signal to a previous state if the sensing signal is within the hysteresis range upon powering on the sensor.

Features may include one or more of the following. The ambient condition sensing means may include one or more sensing elements. The digital signal generating means may include a threshold comparison circuit. The digital signal generating means may be operative to set the level of the digital signal according to the comparison if the sensing signal is not within the hysteresis range upon powering on the sensor. The state restoring means may be responsive to a hysteresis restoration state from a source external to the sensor. The state restoring means may be operative to set the state of the digital signal to the previous state for as long as the sensing signal remains within the hysteresis range.

BRIEF DESCRIPTION OF THE DRAWINGS

Other aspects, features, and advantages of the claimed subject matter will become more fully apparent from the following detailed description, the appended claims, and the accompanying drawings in which like reference numerals identify similar or identical elements. Reference numerals that are introduced in the specification in association with a drawing figure might be repeated in one or more subsequent figures without additional description in the specification in order to provide context for other features.

DETAILED DESCRIPTION

As used herein, the term "magnetic field sensor" describes a circuit that uses one or more magnetic field sensing elements to detect variations in a magnetic field. Magnetic field sensors are used in a variety of applications, including, but not limited to, sensing an angle of a direction of a magnetic field, sensing a magnetic field generated by a current carried by a conductor, sensing the proximity, movement or rotation of a ferromagnetic object, etc. As used herein, the term "magnetic field sensing element" describes electronic elements that can sense a magnetic field. The magnetic field sensing element can be, but is not limited to, a Hall effect element, a magnetoresistance element, or a magnetotransistor. There are different types of Hall effect elements, for example, a planar Hall element, a vertical Hall element, and a Circular Vertical Hall (CVH) element. There are also different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element might be a single element or, alternatively, might include two or more magnetic field sensing elements arranged in various configurations, (e.g., a half bridge or full bridge). Depending on the device type and other application requirements, the magnetic field sensing element might be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Described embodiments provide circuits, systems and methods for controlling the hysteresis state of one or more sensors, or sensor channels. For example, in some embodiments, a sensor may track rotations of a magnet, such as a motor, shaft, etc. Such a sensor may be implemented as a dual-channel, two-dimensional magnetic field sensor that measures a magnetic field in two dimensions. The magnetic field sensor may output an analog signal based upon the measured magnetic field, which is related to the rotation and direction of rotation of the magnet. The analog signal may be compared to a threshold to generate a sensor output signal. In generating the sensor output signal, hysteresis may be employed to prevent undesirable toggling of the output signal as the analog input signal changes.

In certain control systems, the sensor or portions thereof may be temporarily powered down to reduce power consumption, such as when the magnet is not rotating. The sensor may be powered on or restarted before starting to rotate the magnet. If, upon powering on the sensor, the sensor input signal is in the hysteresis region, the state of the sensor output may be different from the state at shutdown of the sensor, which could lead to an incorrect output, and, thus, could lead to counting an incorrect number of revolutions of the magnet, etc. Described embodiments restore the hysteresis state of the sensor from before shut down, thereby preventing incorrect output when the sensor is powered on.

Figure 1:
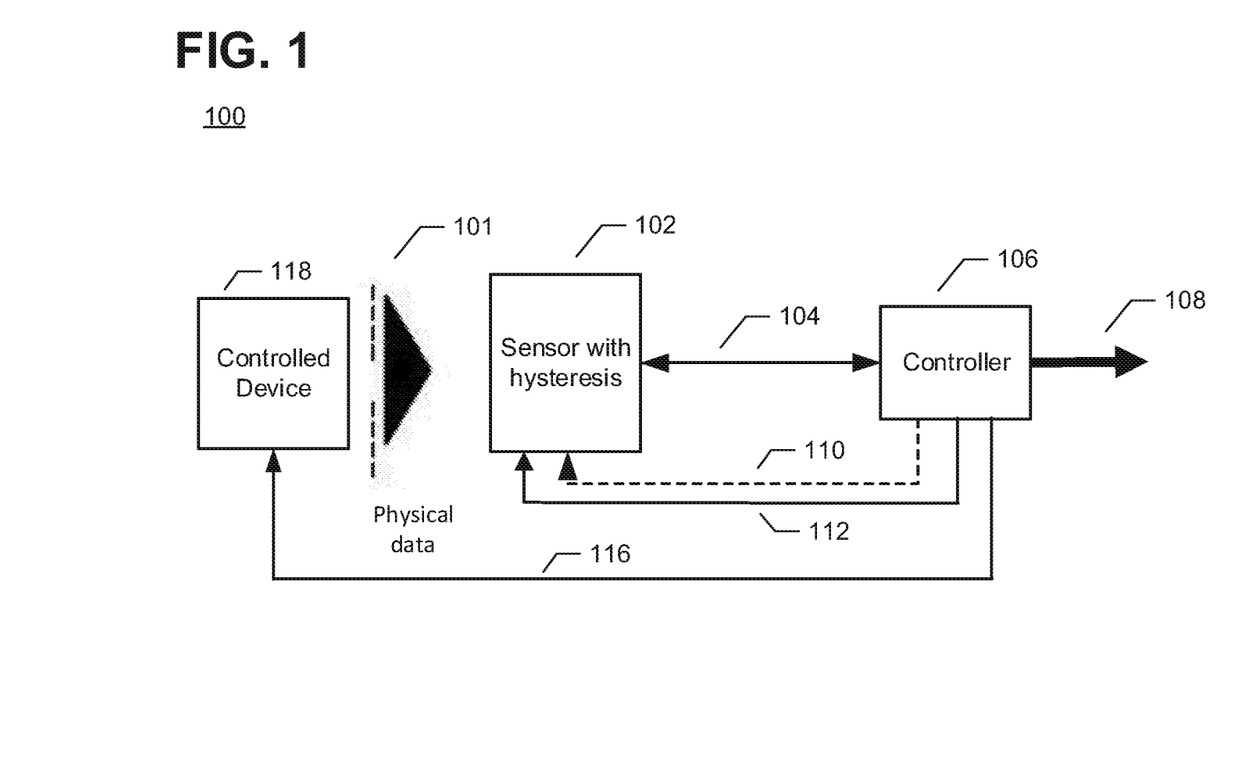
FIG. 1 is a block diagram showing a control system including a sensor with hysteresis restoration in accordance with illustrative embodiments.

Referring to FIG. 1, a block diagram of an illustrative control system 100 is shown. Control system 100 may be located proximate to an environment or element of interest (generally, "target") for which sensor data is desired to be sensed. In the illustrative embodiment shown in FIG. 1, controlled device 118 may be the target. Control system 100 may generally be capable of providing information about a target and/or the control system itself using a formatted output signal 108. Described embodiments of control system 100 may be employed in motor control and/or automotive environments, although control system 100 may be employed in other environments.

In embodiments where control system 100 is deployed in a vehicle, control system 100 may monitor operating parameters such as current, speed, angle, linear position, rotational direction, temperature, etc. of an article, such as controlled device 118. The sensor output signal 104 may be provided over a communication bus to a system controller 106, such as an Electronic/Engine Control Unit (ECU) or Engine Control Module (ECM), which processes data provided by one or more sensors 102.

As shown in FIG. 1, control system 100 may include sensor with hysteresis 102, which provides associated sensor output signals 104 to controller 106. Sensor 102 may include one or more sensors to determine conditions or physical data 101 related to the controlled device 118. For example, sensor 102 may include one or more magnetic field sensors to sense the position and/or movement of a ferromagnetic target object associated with controlled device 118. Other sensors may additionally or alternatively be employed, for example temperature sensors, humidity sensors, light (or optical) sensors, accelerometers, gyroscopes, pressure sensors, gas sensors, bolometers, sound sensors, or other sensors. For example, in some embodiments, sensor 102 may include sensors that are similar to the types described in U.S. Pat. No. 6,815,944, filed on Oct. 29, 2002, U.S. Pat. No. 7,026,808, filed on Sep. 23, 2004, U.S. Pat. No. 8,624,588, filed on Jul. 31, 2008, U.S. Pat. No. 9,151,771, filed on Dec. 2, 2013, U.S. Pat. No. 8,994,369, filed on Dec. 2, 2013, and U.S. Pat. No. 8,754,640, filed on Jun. 18, 2012, all of which are incorporated herein by reference in their entireties. In some embodiments, sensor 102 may be implemented in an integrated circuit (IC).

In embodiments where control system 100 is deployed in a vehicle, controller 106 may be implemented as an ECU or ECM of the vehicle. Controller 106 may be in communication with controlled device 118 via one or more signals 116 to control or operate controlled device 118. For example, controlled device 118 may be a motor or other system for which physical motion may desirably be sensed. For example, sensor 102 may include one or more magnetic field sensors to sense the position and/or rotation of a motor.

Controller 106 may generate one or more output signals 108, which may be communicated to one or more remote devices (not shown) coupled to controller 106. In some embodiments, sensor signals 104 and/or controller output signals 108 may be generated as a signal pulse train that includes multiple pulses. The pulses may be generated in response to physical data 101 sensed by sensor 102. Each pulse may have one or more different characteristics including, but not limited to, different amplitudes and pulse widths. The different characteristics (e.g., position, amplitude, width) of each of the pulses may be used to provide a variety of information related to the target and/or the control system itself. For example, sensor signals 104 may communicate data (e.g., data bits or data words) about physical data 101 sensed by sensor 102.

In some embodiments, controller output signals 108 may be generated in accordance with one of a variety of formats, for example a pulse-width modulated (PWM) signal format, a Single Edge Nibble Transmission (SENT) format, a Serial Peripheral Interface (SPI) format, a Local Interconnect Network (LIN) format, a CAN (Controller Area Network) format, an Inter-Integrated Circuit ($I^2C$) format, or other similar signal formats.

As shown in FIG. 1, controller 106 may be in communication with sensor 102 via control signal 110 and control signal 112. For example, as will be described, control signal 112 may be employed to power on and off the sensor 102 and signal 110 may be employed to restore a hysteresis state to the sensor at power on of sensor 102 (and may be referred to herein as a hysteresis state restoration signal, hysteresis restoration signal, or hysteresis restoration state).

Figure 2:
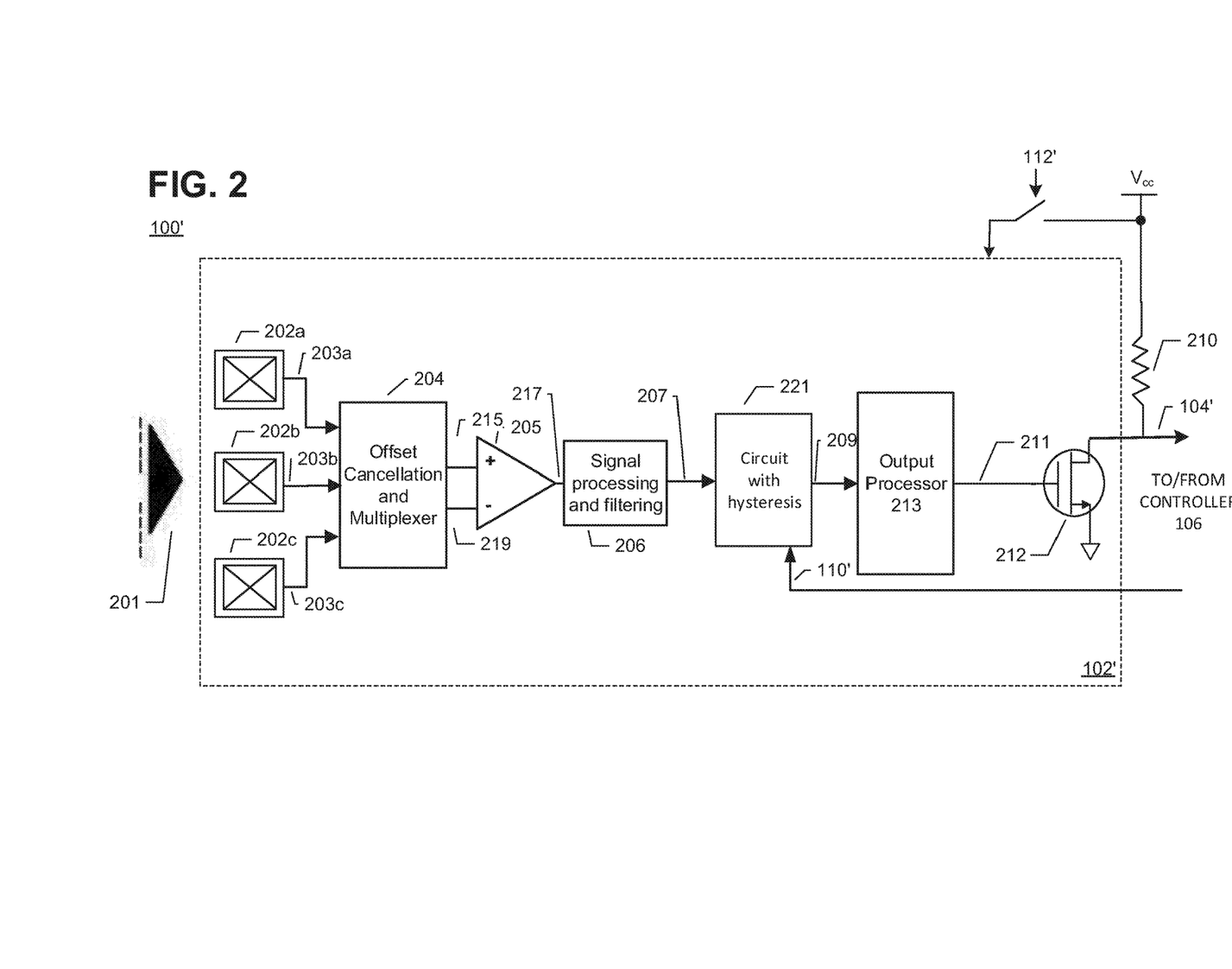
FIG. 2 is a schematic diagram of the control system including a sensor with hysteresis restoration of FIG. 1 in accordance with illustrative embodiments.

Referring to FIG. 2, additional detail of an illustrative embodiment of control system 100 is shown as control system 100'. As shown in FIG. 2, in some embodiments, control system 100' may be employed as a magnetic field sensor, for example to detect variations in a sensed magnetic field 201 due to characteristics and/or mechanical features of a ferromagnetic target (not shown), for example to detect, motion, speed, rotation, and/or position of the target. Such a magnetic field sensor may include one or more magnetic field sensing elements.

For example, sensor 102' may include or be coupled to one or more magnetic field sensing elements 202a, 202b and 202c, referred to generally as magnetic field sensing elements 202. Magnetic field sensing elements 202 may be subjected to magnetic field 201. In some embodiments, magnetic field 201 may be generated by a back bias magnet (not shown) and may be influenced by a ferromagnetic target (not shown) such that magnetic field sensing elements 202a, 202b and 202c each experience different magnitudes of magnetic fields as the target moves.

Signals 203a, 203b and 203c from magnetic field sensing elements 202a, 202b and 202c, respectively, are provided to offset cancellation and multiplexer block 204. Offset cancellation and multiplexer block 204 may receive magnetic field signals 203a, 203b and 203c, and generate a multiplexed magnetic field signal having a series sequence of magnetic field signals 203a, 203b and 203c. In some embodiments, offset cancellation and multiplexer block 204 may be operable to reduce a direct current (DC) offset of the multiplexed magnetic field signal. Offset cancellation and multiplexer block 204 may generate a differential signal 215, 219 for coupling to amplifier 205. Amplifier 205 generates difference signal 217, which is provided to signal processing and filtering circuit 206. Signal processing and filtering circuit 206 may generate offset adjusted signal 207, for example, such that signal 207 is within an operational range of a circuit with hysteresis 221. Signal processing and filter block 206 may also optionally filter undesired signal components from signal 217. In some embodiments, signal processing and filtering circuit 206 may further process signal 217, for example to provide bandwidth and temperature compensation, linearization and/or clamping. For embodiments in which magnetic field sensing elements 202a, 202b and 202c are Hall effect elements, signal processing and filtering circuit 206 may chop (or current spin) the Hall effect elements to reduce apparent offset voltages of the Hall elements. It will be appreciated that while the embodiment of FIG. 2 is shown to include a plurality of magnetic field sensing elements 202a-202c with output signals 203a-203c processed by a single processing channel including elements 204, 205, and 206, in some embodiments a plurality of magnetic field sensing elements can be individually processed (i.e., not multiplexed) by like elements in parallel paths or channels for individual, parallel coupling to the circuit with hysteresis 221.

The circuit with hysteresis 221 generates digital signal 209, which may be provided to controller 106, for example as sensor output signal 104'. Digital signal 209 has a digital value representative of the magnetic field sensed by magnetic field sensing elements 202a, 202b, and 202c. In some embodiments, the circuit with hysteresis 221 may be a threshold comparison circuit to generate digital signal 209 as a single bit digital signal. An example threshold comparison circuit 221 is a Schmitt trigger circuit or window comparator circuit as shown in FIG. 3A. The circuit with hysteresis 221 is referred to herein interchangeably as threshold comparison circuit 221.

As shown in FIG. 2, threshold comparison circuit 221 receives signal 110' that may restore a previous hysteresis state to the sensor upon power up. Hysteresis restoration state signal 110' may be provided by the controller 106 to the threshold comparison circuit 221 upon power up to set the output of the threshold comparison circuit to the proper level in order to thereby resolve ambiguity that may occur if the sensed signal is within the hysteresis region upon power up, as will be described.

In some embodiments, digital signal 209 may be provided to an output processor 213 to generate sensor output signal 104'. For example, as shown in FIG. 2, the output signal 221 of output processor 213 may be coupled to a transistor 212. Transistor 212 may operate in an open drain mode when implemented as a MOSFET (or an open collector mode if implemented as a BJT) with a pull-up resistor 210 to generate output signal 104', although other implementations are possible, such as a push-pull output, for example.

A power control signal 112' may be provided (e.g., by the controller 106) at a first level to turn off power to the sensor 102' (e.g., by decoupling the sensor from a voltage source $V_{cc}$) during operating times when magnetic field sensing is not necessary or desired (e.g., when a controlled device is not moving). Conversely, the power control signal 112' may be provided at a second level to turn on power to the sensor 102' once sensing is again desired.

Figure 2A:
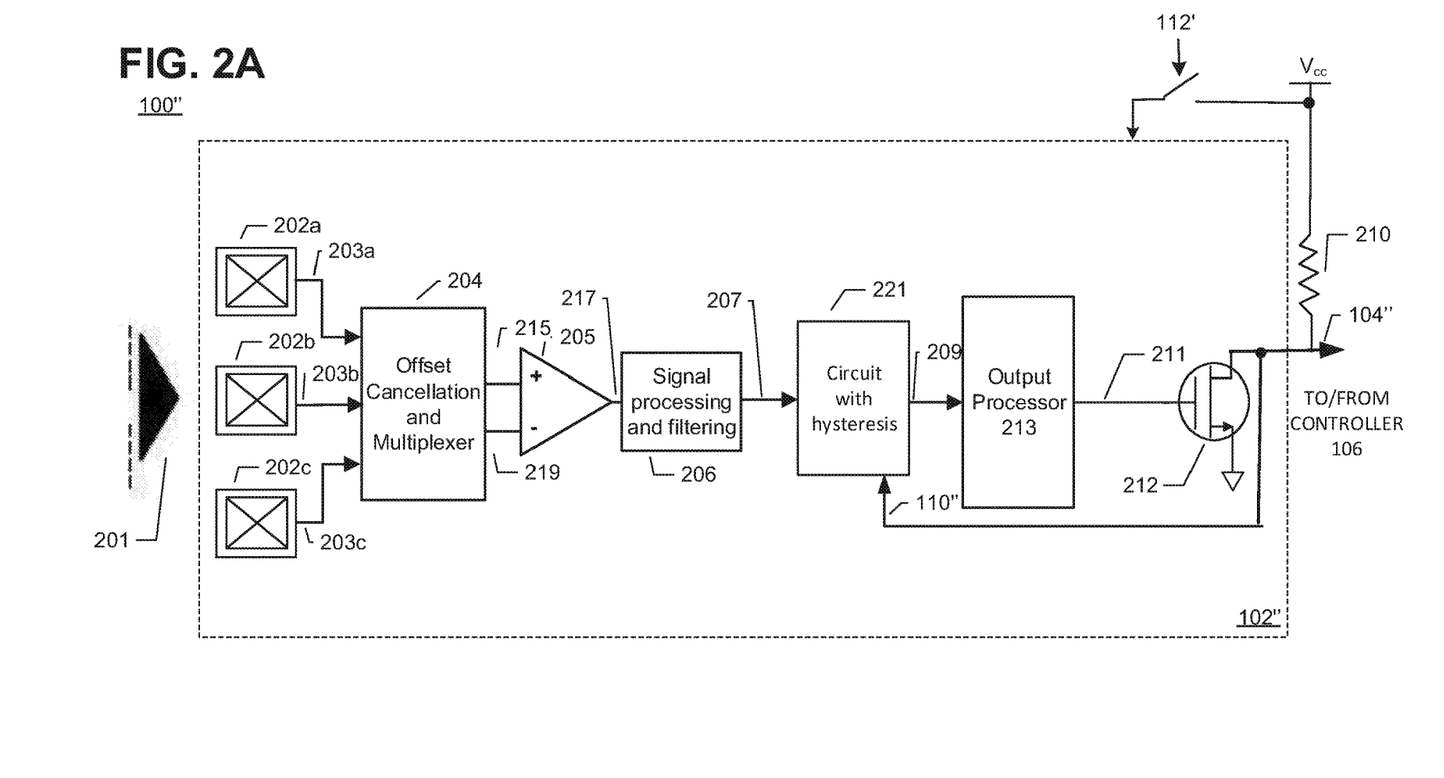
FIG. 2A is a schematic diagram of the control system including an alternative sensor with hysteresis restoration in accordance with illustrative embodiments.

Referring also to FIG. 2A, in which like reference numbers refer to like elements, a sensor 102" includes an alternative configuration for providing the hysteresis restoration state to the threshold comparison circuit 221. Here, the sensor output signal 104" that is coupled to the controller 106 additionally provides the restoration state to the threshold comparison circuit 221, as shown. In operation, upon power up when it is desired to restore the previous hysteresis state to the circuit 221, transistor 212 is disabled. With transistor 212 disabled, the controller 106 provides the previous hysteresis restoration state to the circuit 221 through the dual purpose, bi-directional input/output connection or pin 104". Thereafter, once the hysteresis state has been restored, the transistor 212 is enabled so that the sensor output signal 104" can be provided to the controller 106 at the input/output pin.

Figure 3:
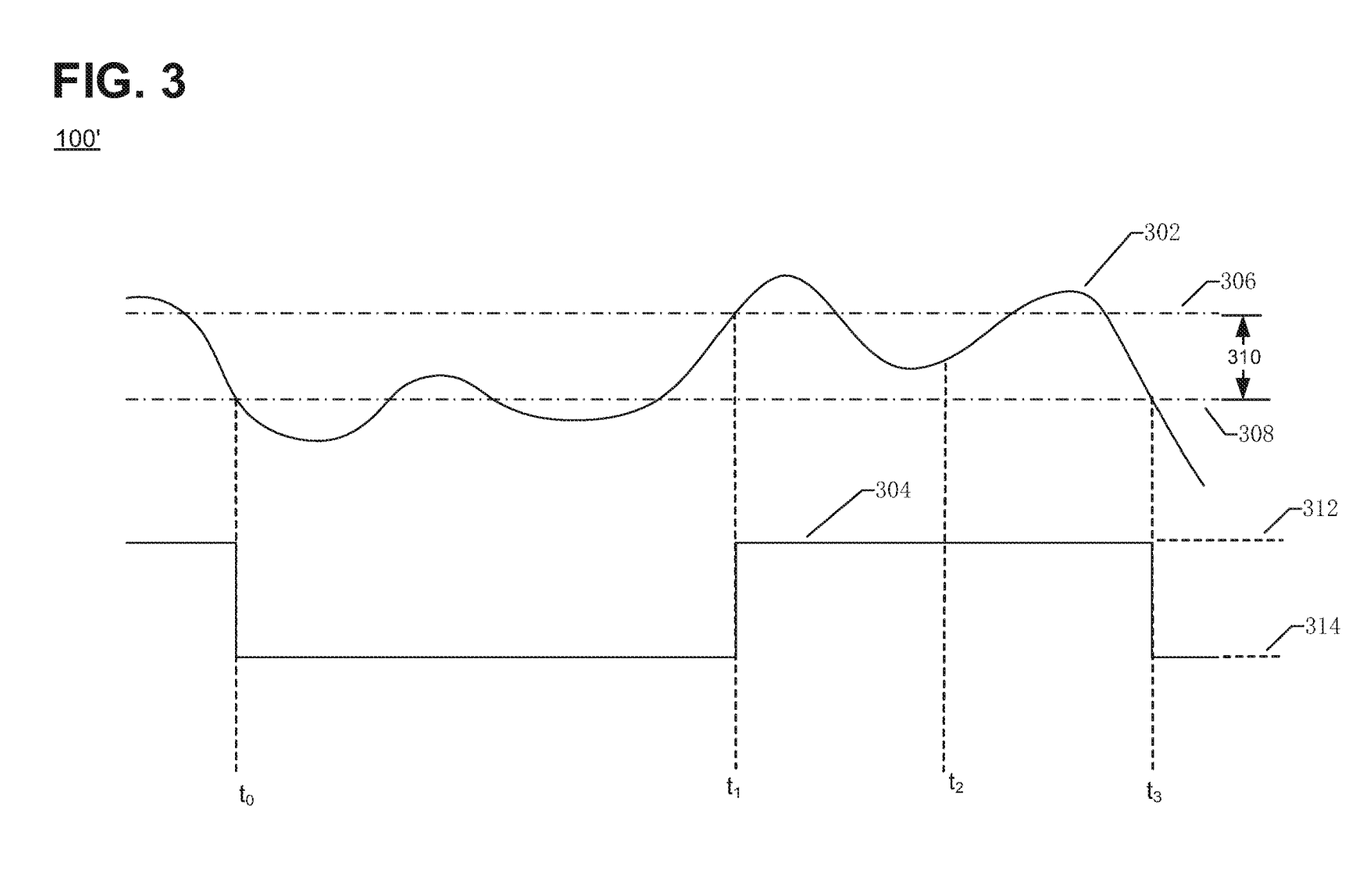
FIG. 3 is a timing diagram showing illustrative signals associated the sensor with hysteresis restoration of FIGS. 1-2A in accordance with illustrative embodiments.
Figure 3A:
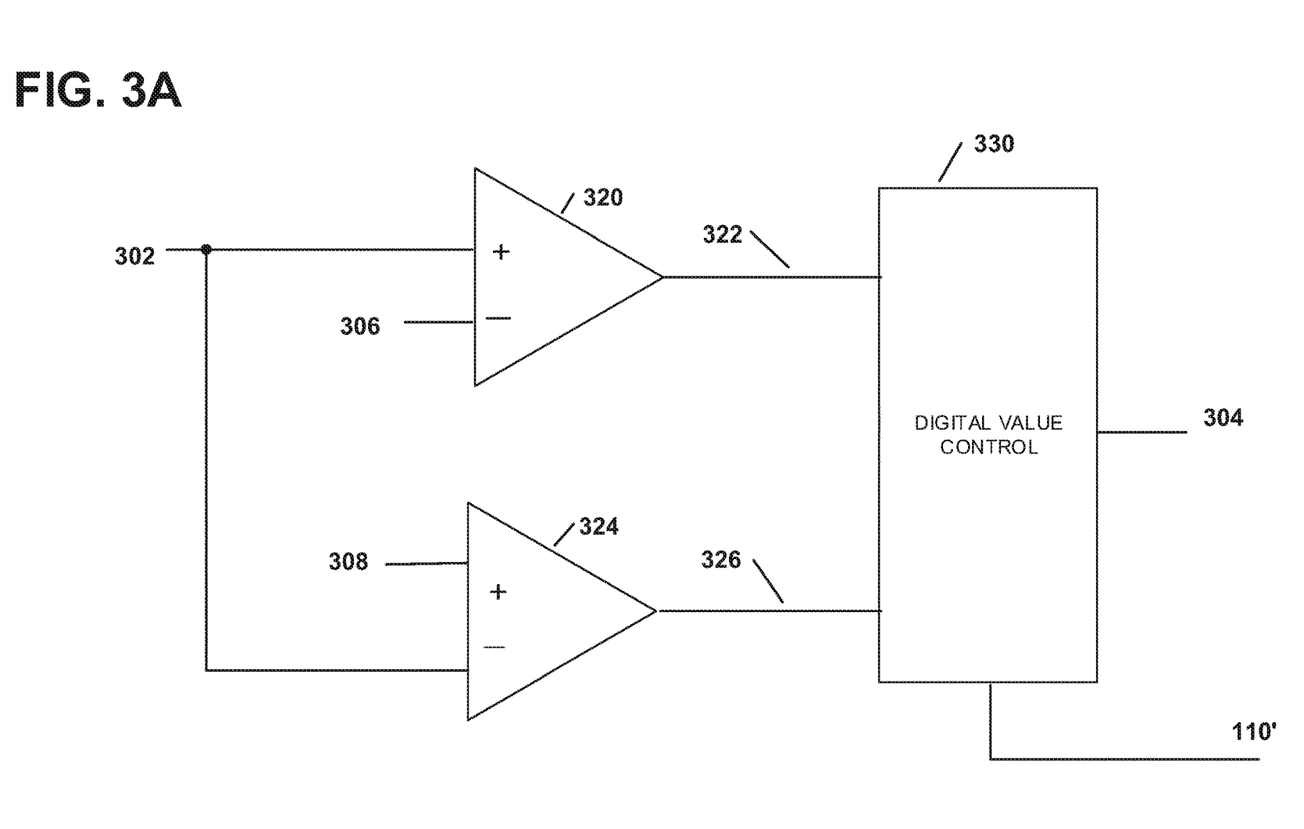
FIG. 3A is a simplified block diagram of an illustrative circuit with hysteresis for use in the control systems of FIGS. 1-2A.

Referring to FIG. 3, an illustrative version of signal 207 of FIGS. 2 and 2A is shown as analog waveform 302. Threshold comparison circuit 221 receives signal 207 as an input, and generates digital signal 209. An illustrative version of digital signal 209 is shown as digital waveform 304. As shown, threshold comparison circuit 221 may have a hysteresis zone, or threshold hysteresis range 310. When analog waveform 302 is greater than hysteresis zone 310 (e.g., above high threshold 306), threshold comparison circuit 221 generates digital waveform 304 at a positive or high digital logic level (e.g., logic high level 312), for example as shown at time $t_1$. When analog waveform 302 is less than hysteresis zone 310 (e.g., below low threshold 308), threshold comparison circuit 221 generates digital waveform 304 at a negative or low digital logic level (e.g., logic low level 314), for example as shown at times $t_0$ and $t_3$. When analog waveform 302 is within hysteresis zone 310 (e.g., less than high threshold 306 and greater than low threshold 308), threshold comparison circuit 221 should not change the output level from its current value, for example as shown at time $t_2$, wherein output waveform 304 is not changed from its current output level (e.g., logic high level 312).

As described herein, some embodiments of control system 100 may turn off sensor 102, for example to reduce power consumption when controlled device 118 is not operating. When sensor 102 is powered on, if signal 302 is within the hysteresis zone (e.g., 310), threshold comparison circuit 221 may improperly toggle digital signal 209. Thus, described embodiments employ hysteresis restoration signal 110 to provide sensor 102 with an indication associated with the state of the sensor output (e.g., the logic level of digital signal 209) before the sensor was turned off.

Thus, as described herein, a sensor (e.g., sensor 102) may sense a magnetic field and classify the sensed magnetic field analog input signal as either high or low to generate a digital output signal (e.g., signal 209). In order to avoid noisy output (e.g., frequent toggling of the digital output as the analog input signal changes), hysteresis may be applied as part of the classification. As described, when the sensor is first powered on, the sensed magnetic field analog input signal may be in the hysteresis region (e.g., region 310 of FIG. 3), which may create an ambiguity in generating the sensor output (e.g., a question of whether the output signal should be high or low). Conventional systems may commonly resolve this ambiguity by setting a default output level upon power up. For example, conventional systems may set the default digital output level as logic low when the sensed magnetic field analog input signal is in the hysteresis region at power up.

As described, in some embodiments a controller 106 in communication with the sensor 102 may turn the sensor off in order to save power. For example, in an illustrative embodiment, the sensor may be employed to monitor and/or count the rotations of a motor. When the motor is stopped, the controller may turn off the sensor 102 to reduce power consumption. When the sensor is frequently turned on and off, the hysteresis ambiguity upon startup may be present more often. In the example of monitoring the rotation of a motor, this ambiguity could result in the counting of incorrect digital output pulses and, hence, an incorrect determination of a position of the motor, a number of rotations of the motor, or a position of an article driven by the motor. Thus, described embodiments store the digital output level of the sensor prior to power down of the sensor, and use the stored level as a hysteresis restoration value, state, or signal when the sensor is turned back on and the sensed magnetic field analog input signal is in the hysteresis region.

In some embodiments, the hysteresis state of a sensor after power-on can be set, or restored by an input into the sensor (e.g., 110), for example by a source external to the sensor, such as controller 106. Referring also to FIG. 3A, the threshold comparison circuit 221 is illustrated by a window comparator configuration including a first comparator 320 generating an output signal 322, a second comparator 330 generating an output signal 326, and a digital value control unit 330 as may be implemented with logic circuitry. The first comparator output signal 322 is at a logic high level when the analog input signal 302 is greater than the high threshold value 306 and at a logic low level when the analog input signal 302 is less than the high threshold value 306 and the second comparator output signal 326 is at a logic high level when the input signal 302 is less than the low threshold value 308 and at a logic low level when the input signal 302 is greater than the low threshold value 308. The digital value control unit 330 is responsive to the hysteresis restoration state 110' and the first and second comparator output signals 322 and 326 to generate the digital waveform 304.

In operation, if, upon power up, the first and second comparator output signals 322 and 326 are both at a logic low level (i.e., an indication that the analog input signal 302 is in the hysteresis zone 310), then the digital waveform 304 is set to the value of the hysteresis restoration state 110'. If the analog waveform 302 becomes greater than hysteresis zone 310 (e.g., above high threshold 306), then the first comparator output signal 322 is high and the threshold comparison circuit 221 generates digital waveform 304 at a positive or high digital logic level (e.g., logic high level 312), for example as shown at time $t_1$. If the analog waveform 302 is less than hysteresis zone 310 (e.g., below low threshold 308), then the second comparator output signal 326 becomes high and the threshold comparison circuit 221 generates digital waveform 304 at a negative or low digital logic level (e.g., logic low level 314), for example as shown at times $t_0$ and $t_3$.

It will be appreciated that while the threshold comparison circuit 221 is illustrated in FIG. 3A with a window comparator configuration, various other arrangements are possible to achieve the desired hysteresis restoration functionality. As one example, the threshold comparison circuit 221 can be implemented as a timed system including a single comparator that subsequently compares the analog input signal 302 to the high threshold value 306, checks the result of the comparison, compares the analog input signal 302 to the low threshold value 308, and again checks the comparison result before determining how to proceed (i.e., how to set the value of the digital waveform 304).

In some embodiments such as that shown in FIG. 2A, the hysteresis restoration input to the sensor may be performed through a connection that additionally serves as the output connection of the sensor. For example, in some embodiments, sensor output signal may be provided at a bi-directional input/output (I/O) pin of the sensor. At initial power up of sensor 102, the I/O pin may be set as an input to receive the hysteresis state restoration signal. Once the hysteresis is determined, the I/O pin may be set as an output to provide sensor output signal 104. In such an embodiment, open-drain (or open-collector) logic levels may be employed. In other embodiments such as that shown in FIG. 2, a separate input pin or connection (e.g., 110'), different than the connection (e.g., 104') at which the sensor output signal is provided, may be employed.

In some embodiments, the sensor may sample the hysteresis restoration signal once (e.g., once at initial power up). In some embodiments, the sensor may continue to sample the hysteresis restoration signal for as long as the sensed magnetic field analog input signal is in the hysteresis region. For example, in such embodiments, a bidirectional I/O pin may be employed to both provide the digital sensor output (e.g., signal 104) and receive the hysteresis restoration signal. In such an embodiment, open-drain (or open-collec-tor) logic levels may be employed. When the sensed magnetic field analog input signal leaves the hysteresis region, the I/O pin may be used as an output. In such embodiments, the controller may set, via the hysteresis restoration signal, the initial output of the sensor not only directly at startup, but for as long as the ambiguous hysteresis wake state exists.

The state of the sensor output signal (e.g., signal 104) may be logic high (e.g., logic high level 312), logic low (e.g., logic low level 314), or a neutral level (e.g., half voltage between logic high level 312 and logic low level 314, a high impedance tristate condition, etc.). The controller may set, via the hysteresis restoration signal, the output of the sensor for as long as the sensed magnetic field analog input signal is in the hysteresis region. The controller could optionally defer or delay setting the output of the sensor by using a neutral input.

As a further example, in some embodiments, sensor 102 may have two output channels A and B. For example, in the magnetic field sensor shown in FIG. 2, two of the magnetic field sensing elements 202 may be active at any one time. In one such embodiment, one output channel of sensor 102 may be indicative of a speed of rotation of a motor, and a second output channel may be indicative of a direction of rotation of the motor. For example, the speed output channel may be the exclusive-OR of the outputs of the two active magnetic field sensing elements. The rising and falling edges of the magnetic field sensing signals may then be indicative of the direction of rotation of the motor to generate the second output channel. As described herein, the sensed magnetic field analog input signal to either of the active magnetic field sensing elements may be in the hysteresis region at power up of sensor 102. Typically, the system is designed in a way that prevents both channels being in the hysteresis region simultaneously. For example, this may be achieved by having two channels sense the magnetic field in two orthogonal directions or by having two channels sense the magnetic field in the same direction, but with both channels placed at an offset to ensure that one sees a maximum field strength as the other is transitioning between positive and negative field.

In such a two channel implementation, one ambiguous channel state (e.g., in the hysteresis region at startup) can be resolved. For example, if the sensed magnetic field analog input signal of a first magnetic field sensing element, A, is in the hysteresis region at startup of sensor 102, the hysteresis recovery state may be determined by A=B XOR OUT, where OUT is the digital signal (e.g., 209). Similarly, if the sensed magnetic field analog input signal of a second magnetic field sensing element, B, is in the hysteresis region at startup of sensor 102, the hysteresis recovery state may be determined by B=A XOR OUT.

In another two channel implementation, the first output channel may be indicative of the output of a first one of the magnetic field sensing elements, and the second output channel may be indicative of the output of a second one of the magnetic field sensing elements. In such an embodiment, the hysteresis level of each channel may be restored independently (e.g., process 400 of FIG. 4 may be performed independently for each channel).

Figure 4:
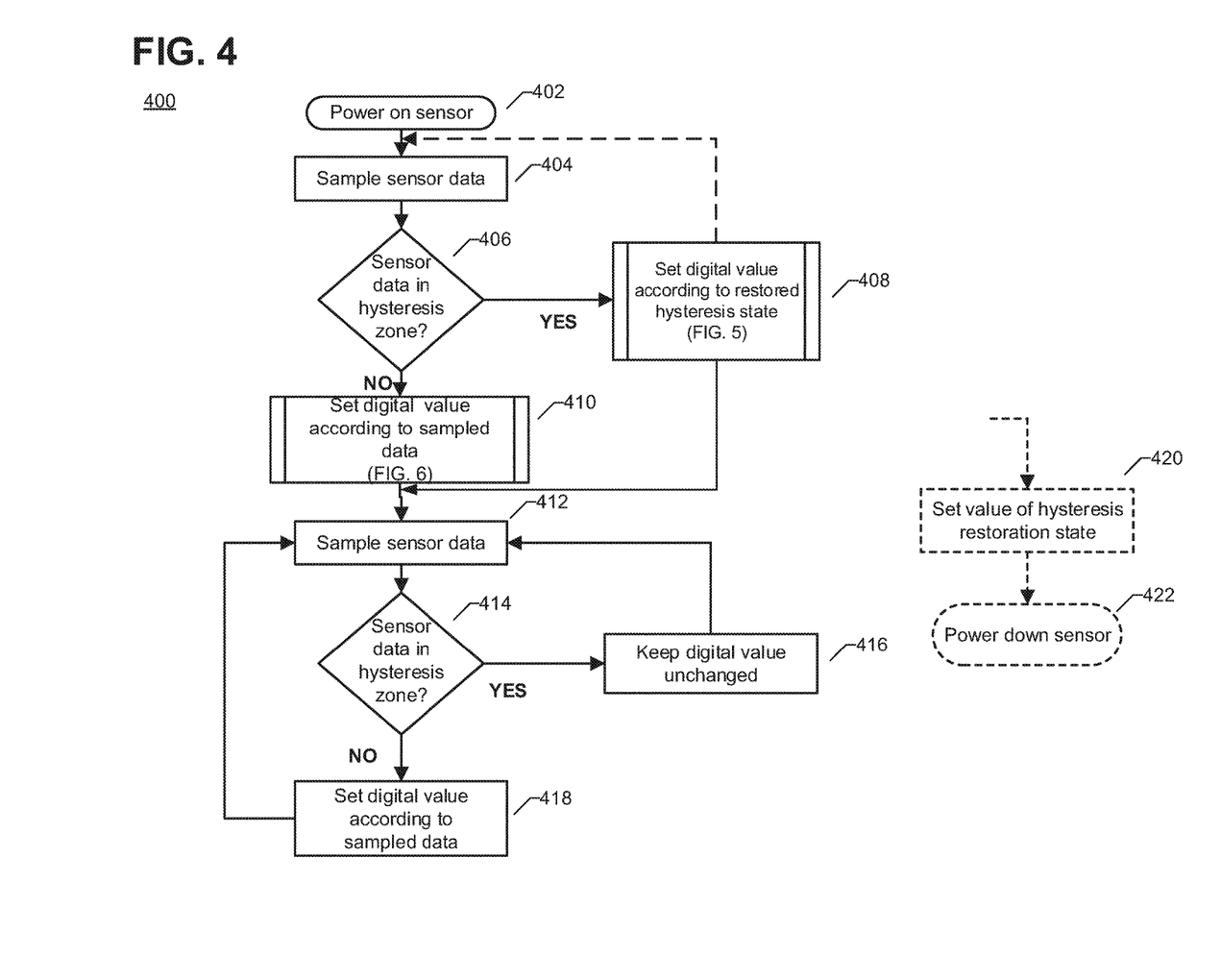
FIG. 4 is a flow diagram showing an illustrative process for operating the sensor with hysteresis restoration of FIGS. 1-2A in accordance with illustrative embodiments.

Referring to FIG. 4, an illustrative process, 400, is shown for operating control system 100. At block 402, sensor 102 is powered on, and at block 404, the sensor data is sampled (e.g., a value of signal 207 is compared to one or more thresholds by threshold comparison circuit 221). At block 408, if the sensor data (e.g., signal 207) is within the hysteresis range (e.g., range 310), then at block 408, threshold comparison circuit 221 sets digital value 209 based upon a restored hysteresis level, for example as indicated by hysteresis restoration signal 110. Process 400 proceeds to block 412. At block 408, if the sensor data (e.g., signal 207) is not within the hysteresis range (e.g., is not within range 310), then at block 410, threshold comparison circuit 221 sets digital value 209 based upon the sampled value of signal 207. For example, if the value of signal 207 is greater than high threshold 306, threshold comparison circuit 221 sets digital value 209 logic high (e.g., to logic high value 312), and if the value of signal 207 is less than low threshold 308, threshold comparison circuit 221 sets digital value 209 logic low (e.g., to logic low value 314). Block 408 is described in greater detail in regard to FIG. 5. Block 410 is described in greater detail in regard to FIG. 6.

Following the start up process that concludes with block 408 or 410, at block 412, threshold comparison circuit 221 may continue sampling the sensor data (e.g., signal 207), for example as sensor 102 continues to operate and sense physical data 201. At block 414, if the sensor data (e.g., signal 207) is within the hysteresis range (e.g., range 310), then at block 416, threshold comparison circuit 221 does not change the value of digital signal 209. Process 400 may return to block 412 to continue sampling the sensor data. If, at block 414, if the sensor data (e.g., signal 207) is not within the hysteresis range (e.g., range 310), then at block 418, threshold comparison circuit 221 changes the value of digital signal 209 based upon the sampled value of signal 207. For example, if the value of signal 207 is greater than high threshold 306, threshold comparison circuit 221 sets digital value 209 logic high (e.g., to logic high value 312), and if the value of signal 207 is less than low threshold 308, threshold comparison circuit 221 sets digital value 209 logic low (e.g., to logic low value 314). Process 400 may return to block 412 to continue sampling the sensor data.

As indicated by dashed blocks 420 and 422, sensor 102 may be powered down at a time during its operation. At block 420, the value of hysteresis restoration signal 110 is set based upon the current value of digital value 209. In an embodiment, the hysteresis state is the same as the state of the digital signal 209. Thus, by receiving the sensor output 104, the controller is provided with the hysteresis state, which state can be stored and then provided back to the sensor upon the next power up of the sensor. At block 422, sensor 102 is powered down and process 400 completes.

Figure 5:
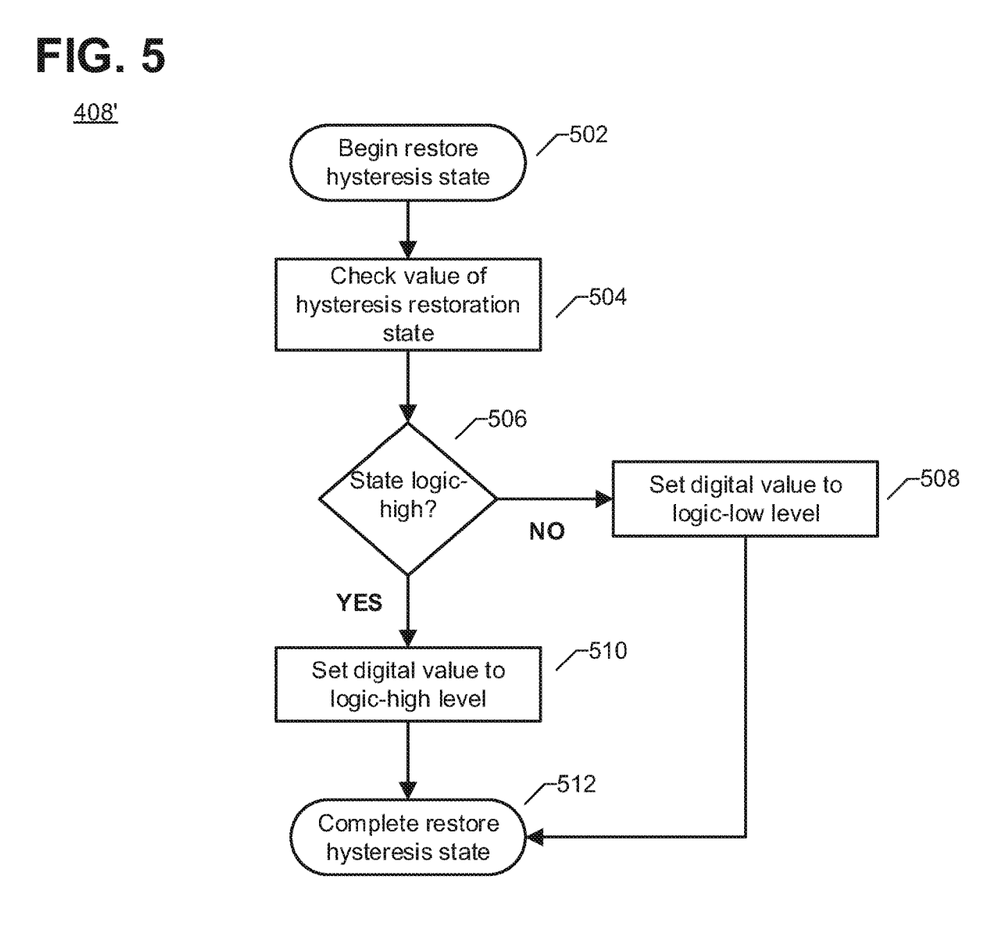
FIG. 5 is a flow diagram showing additional detail of the process of FIG. 4 in accordance with illustrative embodiments.

Referring to FIG. 5, additional detail of block 408 is shown as illustrative process 408' for setting the digital value (e.g., digital signal 209) according to the restored hysteresis level. At block 502, process 408' begins. At block 504, sensor 102 checks the value of the hysteresis restoration signal 110. At block 506, if the hysteresis restoration signal 110 is logic high, then at block 510, threshold comparison circuit 221 sets digital value 209 to a logic high level (e.g., to logic high level 312). At block 512, process 408' completes. If, at block 506, the hysteresis restoration signal 110 is logic low, then at block 508, threshold comparison circuit 221 sets digital value 209 to a logic low level (e.g., to logic low level 314). At block 512, process 408' completes.

Figure 6:
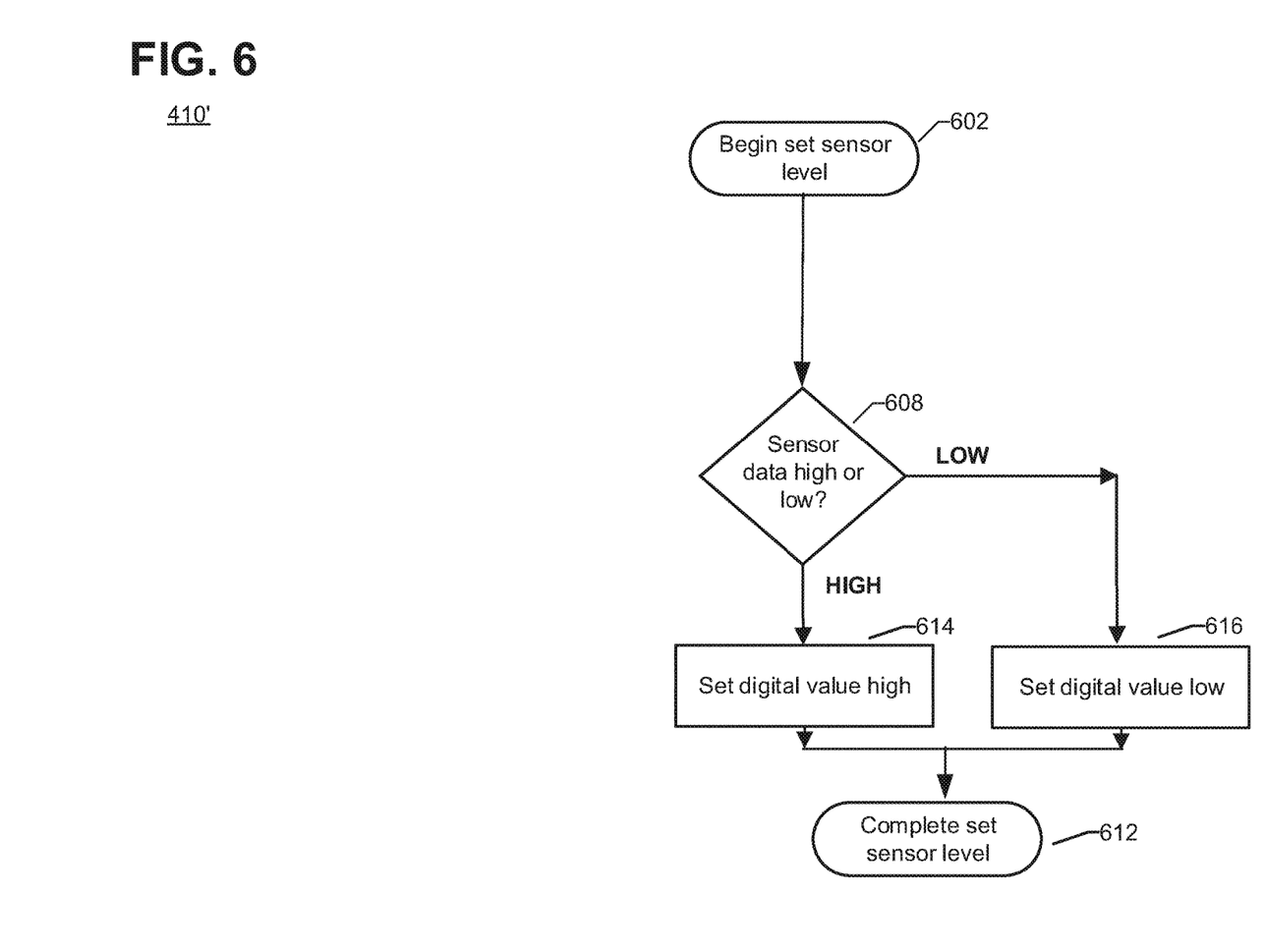
FIG. 6 is a flow diagram showing additional detail of the process of FIG. 4 in accordance with illustrative embodiments.

Referring to FIG. 6, additional detail of block 410 is shown as illustrative process 410' for setting the digital value (e.g., digital signal 209) according to the sampled data (e.g., signal 207). At block 602, process 410' begins. At block 608, if the sampled value of signal 207 is logic high, then at block 614, threshold comparison circuit 221 sets digital output signal logic high (e.g., to logic high level 312). Process 410' completes at block 612. If, at block 608, the sampled value of signal 207 is logic low, then at block 616, threshold comparison circuit 221 sets digital output signal logic low (e.g., to logic low level 314). Process 410' completes at block 612.

Figure 7:
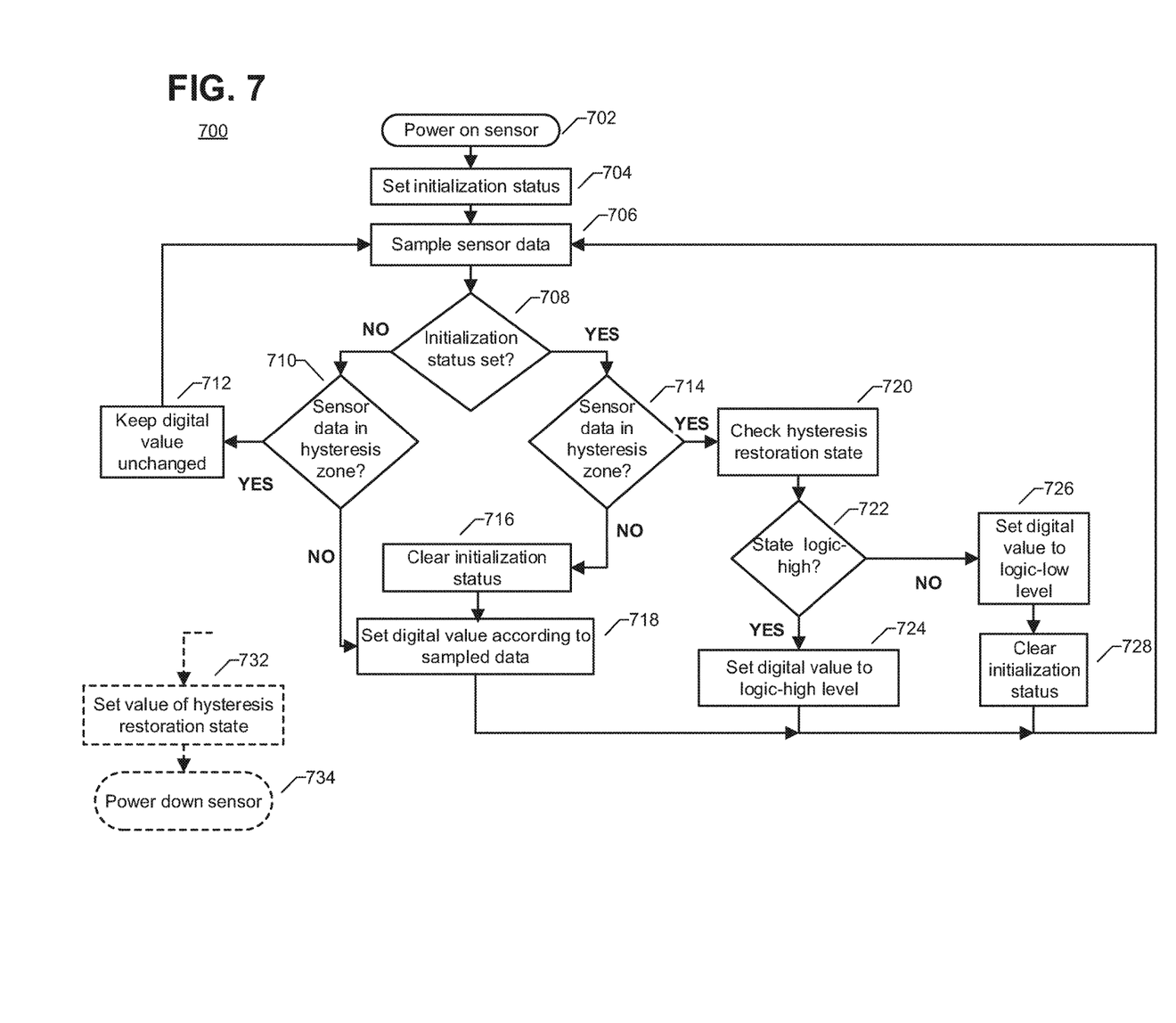
FIG. 7 is a flow diagram showing another illustrative process for operating the sensor with hysteresis restoration of FIGS. 1-2A in accordance with illustrative embodiments.

Referring to FIG. 7, an illustrative process, 700, is shown for operating control system 100. At block 702, sensor 102 is powered on, and at block 704, an initialization status of the sensor is set. For example, the initialization status might be set by controller 106 and provided to threshold comparison circuit 221 as hysteresis restoration signal 110. At block 706, the sensor data is sampled (e.g., signal 207 is processed by threshold comparison circuit 221). At block 708, if the initialization status is set, then at block 714, threshold comparison circuit 221 determines whether the sensed magnetic field analog input signal (e.g., 207) is in the hysteresis region (e.g., 310). If, at block 714, the sensed magnetic field analog input signal (e.g., 207) is not in the hysteresis region (e.g., 310), then at block 716, the initialization status is cleared, and at block 718, the digital value 209 is set based upon the sampled value of the sensed magnetic field analog input signal, for example as described in regard to FIG. 6. Process 700 may return to block 706 to continue sampling the sensed magnetic field analog input signal for as long as sensor 102 remains powered.

If, at block 714, if it is determined that the sensed magnetic field analog input signal (e.g., 207) is in the hysteresis region (e.g., 310), then at block 720, the threshold comparison circuit 221 checks the value of the hysteresis restoration signal 110. If, at block 722, the hysteresis restoration signal is logic high, then at block 724, threshold comparison circuit 221 sets digital signal 209 to the logic high output level, and process 700 returns to block 706. If, at block 722, the hysteresis restoration signal is logic low, then at block 726, threshold comparison circuit 221 sets digital signal 209 to the logic low output level. At block 728, the initialization status is cleared, and process 700 returns to block 706.

If, at block 708, it is determined that the initialization status is not set, then at block 710, threshold comparison circuit 221 determines whether the sensed magnetic field analog input signal (e.g., 207) is in the hysteresis region (e.g., 310). If, at block 710, the sensed magnetic field analog input signal (e.g., 207) is not in the hysteresis region (e.g., 310), then at block 718, the digital value 209 is set based upon the sampled value of the sensed magnetic field analog input signal, for example as described in regard to FIG. 6. Process 700 may return to block 706 to continue sampling the sensed magnetic field analog input signal for as long as sensor 102 remains powered. If, at block 710, the sensed magnetic field analog input signal (e.g., 207) is in the hysteresis region (e.g., 310), then at block 712, the digital value 209 is not changed from its current value, and process 700 may return to block 706.

As indicated by dashed blocks 732 and 734, sensor 102 may be powered down at a time during its operation. At block 732, the value of hysteresis restoration signal 110 is set based upon the current value of digital value 209. At block 734, sensor 102 is powered down and process 700 completes.

Figure 8:
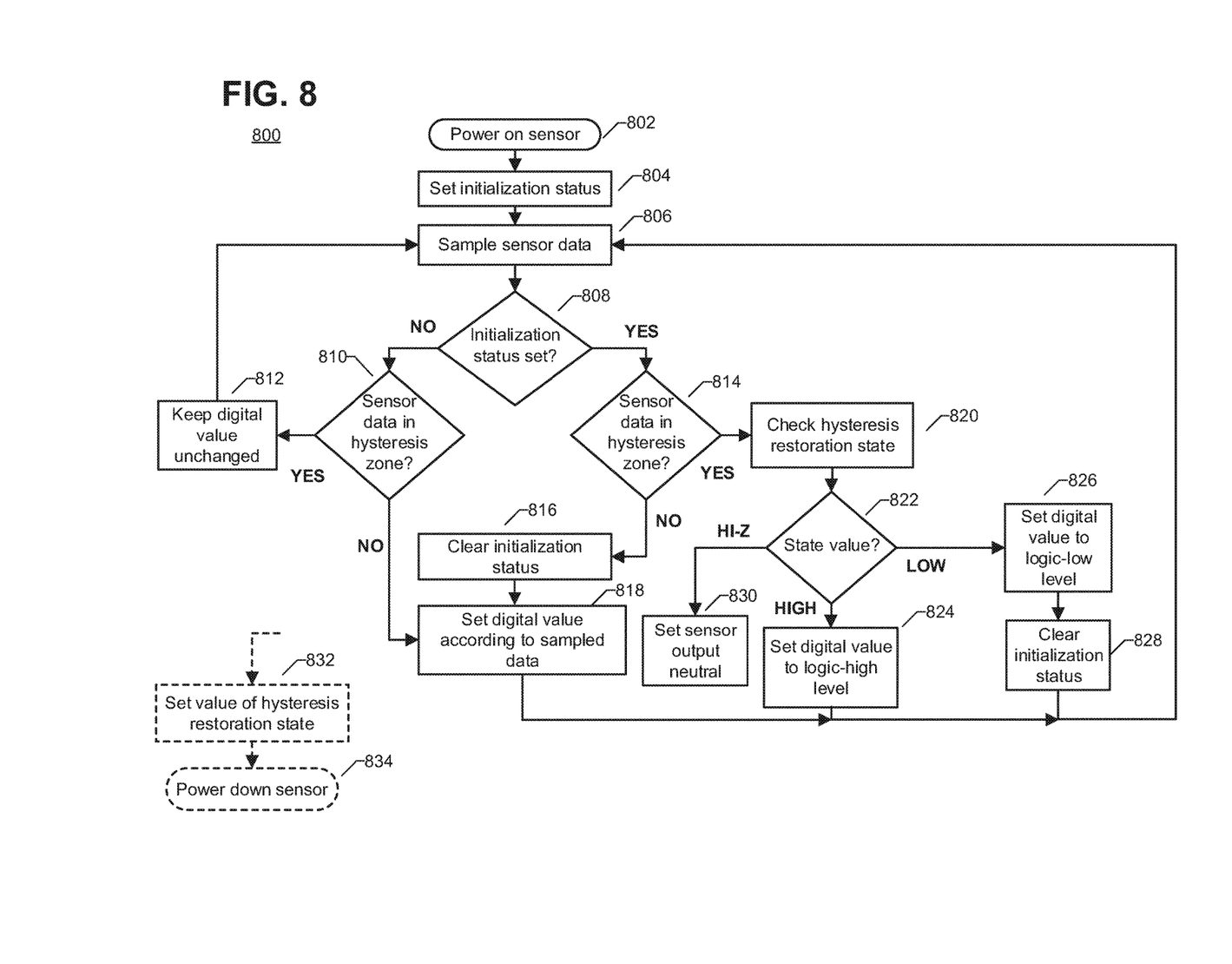
FIG. 8 is a flow diagram showing another illustrative process for operating the sensor with hysteresis restoration of FIGS. 1-2A in accordance with illustrative embodiments.

Referring to FIG. 8, an illustrative process, 800, is shown for operating control system 100. At block 802, sensor 102 is powered on, and at block 804, an initialization status of the sensor is set. For example, the initialization status might be set by controller 106 and provided to threshold comparison circuit 221 as hysteresis restoration signal 110. At block 806, the sensor data is sampled (e.g., signal 207 is processed by threshold comparison circuit 221). At block 808, if the initialization status is set, then at block 814, threshold comparison circuit 221 determines whether the sensed magnetic field analog input signal (e.g., 207) is in the hysteresis region (e.g., 310). If, at block 814, the sensed magnetic field analog input signal (e.g., 207) is not in the hysteresis region (e.g., 310), then at block 816, the initialization status is cleared, and at block 818, the digital value 209 is set based upon the sampled value of the sensed magnetic field analog input signal, for example as described in regard to FIG. 6. Process 800 may return to block 806 to continue sampling the sensed magnetic field analog input signal for as long as sensor 102 remains powered.

If, at block 814, the sensed magnetic field analog input signal (e.g., 207) is in the hysteresis region (e.g., 310), then at block 820, the threshold comparison circuit 221 checks the value of the hysteresis restoration signal 110. If, at block 822, the hysteresis restoration signal is logic high, then at block 824, threshold comparison circuit 221 sets digital signal 209 to the logic high output level, and process 800 returns to block 806. If, at block 822, the hysteresis restoration signal is logic low, then at block 826, threshold comparison circuit 221 sets digital signal 209 to the logic low output level. At block 828, the initialization status is cleared, and process 800 returns to block 806. If, at block 822, the hysteresis restoration signal is in a high impedance state, then at block 830, threshold comparison circuit 221 sets digital signal 209 to a neutral output level (e.g., half the output voltage, etc.).

If, at block 808, the initialization status is not set, then at block 810, threshold comparison circuit 221 determines whether the sensed magnetic field analog input signal (e.g., 207) is in the hysteresis region (e.g., 310). If, at block 810, the sensed magnetic field analog input signal (e.g., 207) is not in the hysteresis region (e.g., 310), then at block 818, the digital value 209 is set based upon the sampled value of the sensed magnetic field analog input signal, for example as described in regard to FIG. 6. Process 800 may return to block 806 to continue sampling the sensed magnetic field analog input signal for as long as sensor 102 remains powered. If, at block 810, the sensed magnetic field analog input signal (e.g., 207) is in the hysteresis region (e.g., 310), then at block 812, the digital value 209 is not changed from its current value, and process 800 may return to block 806.

As indicated by dashed blocks 832 and 834, sensor 102 may be powered down at a time during its operation. At block 832, the value of hysteresis restoration signal 110 is set based upon the current value of digital value 209. At block 834, sensor 102 is powered down and process 800 completes.

In some embodiments, control system 100 may include a processor (e.g., controller 106). As used herein, the term "processor" describes an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals. In some embodiments, the "processor" can be embodied in an application specific integrated circuit (ASIC). In some embodiments, the "processor" can be embodied in a microprocessor with associated program memory. In some embodiments, the "processor" can be embodied in a discrete electronic circuit. The "processor" can be analog, digital or mixed-signal.

Various functions of circuit elements may also be implemented as processing blocks in a software program. Such software may be employed in, for example, a digital signal processor, microcontroller, or general purpose computer.

Thus, described embodiments may be implemented in hardware, a combination of hardware and software, software, or software in execution by one or more processors.

Some embodiments may be implemented in the form of methods and apparatuses for practicing those methods. Described embodiments may also be implemented in the form of program code, for example, stored in a storage medium, loaded into and/or executed by a machine, or transmitted over some transmission medium or carrier, such as over electrical wiring or cabling, through fiber optics, or via electromagnetic radiation. A non-transitory machine-readable medium may include but is not limited to tangible media, such as magnetic recording media including hard drives, floppy diskettes, and magnetic tape media, optical recording media including compact discs (CDs) and digital versatile discs (DVDs), solid state memory such as flash memory, hybrid magnetic and solid state memory, non-volatile memory, volatile memory, and so forth, but does not include a transitory signal per se. When embodied in a non-transitory machine-readable medium, and the program code is loaded into and executed by a machine, such as a computer, the machine becomes an apparatus for practicing the method.

When implemented on a processing device, the program code segments combine with the processor to provide a unique device that operates analogously to specific logic circuits. Such processing devices may include, for example, a general-purpose microprocessor, a digital signal processor (DSP), a reduced instruction set computer (RISC), a complex instruction set computer (CISC), an application specific integrated circuit (ASIC), a field programmable gate array (FPGA), a programmable logic array (PLA), a microcontroller, an embedded controller, a multi-core processor, and/or others, including combinations of the above. Described embodiments may also be implemented in the form of a bitstream or other sequence of signal values electrically or optically transmitted through a medium, stored magnetic-field variations in a magnetic recording medium, etc., generated using a method and/or an apparatus as recited in the claims.

Various elements, which are described in the context of a single embodiment, may also be provided separately or in any suitable subcombination. It will be further understood that various changes in the details, materials, and arrangements of the parts that have been described and illustrated herein may be made by those skilled in the art without departing from the scope of the following claims.

What is claimed is:

1. A sensor comprising:
one or more sensing elements, each responsive to an ambient condition associated with the sensor to generate a sensing signal indicative of a level of the ambient condition;
a threshold comparison circuit responsive to the sensing signal from the one or more sensing elements and configured to generate a digital value associated with a comparison of the sensing signal to a threshold hysteresis range, the threshold comparison circuit comprising an input node to receive a signal representing a hysteresis state; and
an output processor configured to generate a sensor output signal in response to digital values from the threshold comparison circuit, wherein upon powering on the sensor after the sensor is powered off, the threshold comparison circuit is configured to determine whether the sensing signal from the one or more sensing elements is in the hysteresis range and, if the sensing signal from the one of more sensing elements is in the hysteresis range, set the digital value to a predetermined value based upon a hysteresis restoration state associated with the comparison before the sensor is powered off;

wherein the signal hysteresis restoration state is provided to the sensor by an external source electrically coupled to the input node of the threshold comparison circuit.

2. The sensor of claim 1, wherein, if the sensing signal is not in the hysteresis range, the threshold comparison circuit is configured to set the digital value to a logic level associated with the comparison.

3. The sensor of claim 1, wherein the output processor is configured to communicate digital values from the threshold comparison circuit as the sensor output signal.

4. The sensor of claim 1, wherein the output processor is configured to process digital values from the threshold comparison circuit and to provide the sensor output signal in a form indicative of an absolute position, a relative position, a direction of movement, a speed of movement, a direction of rotation, or a speed of rotation of an object located proximate to the sensor.

5. The sensor of claim 1, wherein sensing signals from more than one sensing element are combined to generate a first combined sensing signal for processing by a first sensor channel and sensing signals from more than one sensing element are combined to generate a second combined sensing signal for processing by a second sensor channel.

6. The sensor of claim 5, wherein a phase difference between the first combined sensing signal and the second combined sensing signal is associated with a direction of movement or rotation of the object.

7. The sensor of claim 6, wherein the threshold comparison circuit is responsive to the first combined sensing signal to generate a first digital value associated with a comparison of the first combined sensing signal to the hysteresis range and wherein the threshold comparison circuit is responsive to the second combined sensing signal to generate a second digital value associated with a comparison of the second combined sensing signal to the hysteresis range and wherein an exclusive-OR value of the first digital value and the second digital value is associated with a speed of movement of the object, and wherein a direction of logic-level transition of the first digital value and the second digital value is associated with a direction of movement or rotation of the object.

8. The sensor of claim 5, wherein the threshold comparison circuit is configured to set the first digital value to a predetermined value based on a hysteresis restoration state associated with the first sensor channel and to set the second digital value to a predetermined value based on a hysteresis restoration state associated with the second sensor channel.

9. The sensor of claim 1, wherein the sensor is configured for use in a sensor system, and wherein the sensor output signal is provided to a system controller.

10. The sensor of claim 9, wherein the sensor is configured for use in a motor control system, and wherein the sensor output signal is provided to a motor controller and wherein the sensor is powered off when the motor is not intended to be rotating.

11. The sensor of claim 1, wherein the sensor is implemented as an integrated circuit.

12. The sensor of claim 9, wherein the hysteresis restoration state is provided by the sensor to the system controller in the form of the sensor output signal before the sensor is powered off.

13. The sensor of claim 12, wherein the hysteresis restoration state is provided by the system controller to the sensor at a bidirectional input/output (I/O) pin of the sensor at which the sensor output signal is provided.

14. The sensor of claim 12, wherein the hysteresis restoration state is provided by the system controller to the sensor at a hysteresis restoration input pin of the sensor.

15. The sensor of claim 1, wherein, if the sensing signal is in the hysteresis range, the threshold comparison circuit is configured to repeat determining whether the sensing signal is in the hysteresis range until the sensing signal is no longer in the hysteresis range.

16. The sensor of claim 1, wherein the threshold comparison circuit is a Schmitt trigger circuit.

17. A method for sensing a level of an ambient condition with a sensor configured to be powered off to reduce power consumption and then powered on, comprising:
generating a sensing signal in response to the ambient condition;
comparing, by the threshold comparison circuit, the sensing signal to a threshold hysteresis range to generate a digital signal, wherein the threshold comparison circuit comprises an input node to receive a signal representing a hysteresis restoration state;
upon powering on the sensor, determining whether the sensing signal is within the threshold hysteresis range;
if the sensing signal is within the threshold hysteresis range, setting the digital signal to a predetermined level based on a hysteresis restoration state associated with sensor before the sensor is powered off; and
providing the signal representing the hysteresis restoration state to the sensor from a source external to the sensor and electrically coupled to the input node.

18. The method of claim 17, wherein, if the sensing signal is not within the threshold hysteresis range, setting the digital signal to a logic level associated with the comparison.

19. The method of claim 17, wherein generating the analog sensing signal comprises using a magnetic field sensor.

20. The method of claim 17, further comprising generating a sensor output signal in response to the digital signal.

21. The method of claim 19, wherein generating the sensor output signal comprises generating the sensor output signal to indicate an absolute position, a relative position, a direction of movement, a speed of movement, a direction of rotation, or a speed of rotation of an object located proximate to the sensor.

22. The method of claim 17, further comprising continuing to determine if the sensing signal is within the hysteresis range until the sensing signal is no longer in the hysteresis range.

23. A sensor comprising:
means for sensing an ambient condition to generate a sensing signal;
means for generating a digital signal in response to comparison of the sensing signal to a hysteresis range; and
means for restoring a state of the digital signal to a previous state if the sensing signal is within the hysteresis range upon powering on the sensor;
wherein the state restoring means is responsive to a hysteresis restoration state from a source external to the sensor.

24. The sensor of claim 23, wherein the ambient condition sensing means comprises one or more sensing elements.

25. The sensor of claim 23, wherein the digital signal generating means comprises a threshold comparison circuit.

26. The sensor of claim 23, wherein the digital signal generating means is operative to set the level of the digital signal according to the comparison if the sensing signal is not within the hysteresis range upon powering on the sensor.

27. The sensor of claim 23, wherein the state restoring means is operative to set the state of the digital signal to the previous state for as long as the sensing signal remains within the hysteresis range.

* * * * *

UNITED STATES PATENT AND TRADEMARK OFFICE
CERTIFICATE OF CORRECTION

PATENT NO. : 10,345,417 B2
APPLICATION NO. : 15/426601
DATED : July 9, 2019
INVENTOR(S) : Dominik Geisler Page 1 of 1

It is certified that error appears in the above-identified patent and that said Letters Patent is hereby corrected as shown below:

In the Specification

Column 3, Line 57 delete "associated the sensor with hysteresis" and replace with --associated with the sensor hysteresis--.

Column 6, Line 25 delete "detect," and replace with --detect--.

Column 6, Line 56-57 delete "filter block 206" and replace with --filtering circuit 206--.

Column 10, Line 40 delete "field." and replace with --fields.--.

Column 11, Line 25 delete "414, if the" and replace with --414, the--.

Column 12, Line 24 delete "714, if it" and replace with --714, it--.

In the Claims

Column 15, Line 1 delete "one of more" and replace with --one or more--.

Signed and Sealed this
Seventh Day of April, 2020

Andrei Iancu
*Director of the United States Patent and Trademark Office*